United States Patent
Park et al.

(10) Patent No.: US 11,040,516 B2
(45) Date of Patent: Jun. 22, 2021

(54) GRAPHITE SHEET AND METHOD FOR MANUFACTURING SAME

(71) Applicant: SKC CO., LTD., Suwon-si (KR)

(72) Inventors: Ki Ryun Park, Anyang-si (KR); Myung-Ok Kyun, Suwon-si (KR); Jung-Gyu Kim, Suwon-si (KR); Jung Doo Seo, Suwon-si (KR); Jonggab Baek, Suwon-si (KR); Jong Hwi Park, Suwon-si (KR); Jun Rok Oh, Seoul (KR)

(73) Assignee: SKC CO., LTD., Suwon-si (KR)

( * ) Notice: Subject to any disclaimer, the term of this patent is extended or adjusted under 35 U.S.C. 154(b) by 33 days.

(21) Appl. No.: 15/532,544

(22) PCT Filed: Mar. 22, 2016

(86) PCT No.: PCT/KR2016/002876
§ 371 (c)(1),
(2) Date: Jun. 2, 2017

(87) PCT Pub. No.: WO2016/175453
PCT Pub. Date: Nov. 3, 2016

(65) Prior Publication Data
US 2018/0265362 A1    Sep. 20, 2018

(30) Foreign Application Priority Data
Apr. 30, 2015 (KR) .................. 10-2015-0061804

(51) Int. Cl.
| | | |
|---|---|---|
| *B32B 9/00* | (2006.01) | |
| *H01L 23/373* | (2006.01) | |
| *C01B 32/205* | (2017.01) | |
| *D01F 9/14* | (2006.01) | |
| *C08J 5/18* | (2006.01) | |
| *C01B 32/20* | (2017.01) | |

(52) U.S. Cl.
CPC .............. *B32B 9/007* (2013.01); *B32B 9/00* (2013.01); *C01B 32/20* (2017.08); *C01B 32/205* (2017.08); *C08J 5/18* (2013.01); *D01F 9/14* (2013.01); *H01L 23/373* (2013.01); *B32B 2307/54* (2013.01); *C01B 2204/32* (2013.01)

(58) Field of Classification Search
USPC ........ 428/172, 213, 220, 365, 367, 370, 408
See application file for complete search history.

(56) References Cited

U.S. PATENT DOCUMENTS

| | | | | |
|---|---|---|---|---|
| 4,590,122 A | * | 5/1986 | Levin .................. | B04C 1/00 428/367 |
| 2010/0196716 A1 | | 8/2010 | Ohta et al. | |
| 2011/0011601 A1 | | 1/2011 | Ono et al. | |
| 2014/0332993 A1 | | 11/2014 | Ooshiro et al. | |

FOREIGN PATENT DOCUMENTS

| | | |
|---|---|---|
| CN | 104203817 A | 12/2014 |
| JP | 2000169125 A | 6/2000 |
| JP | 5107191 B2 | 12/2012 |
| JP | 2013-230364 A | 11/2013 |
| JP | 2015010014 A | 1/2015 |
| KR | 10-2010-001782 A | 2/2010 |
| KR | 10-2015-0045314 A | 4/2015 |

OTHER PUBLICATIONS

Japanese Patent Office; Communication dated Jul. 24, 2018 in counterpart application No. 2017-531842.
Hosei Nagano et al., "Thermal diffusivity of graphite sheet at low temperatures", High Temperatures—High Pressures, 2001, pp. 253-259, vol. 33, No. 3.
Tetsuya Uchida et al., "Morphology and modulus of vapor grown carbon nano fibers", J Mater Sci, 2006, pp. 5851-5856, vol. 41, No. 18.
International Search Report for PCT/KR2015/002876, dated Jun. 22, 2016.
State Intellectual Property Office of People's Republic of China; Communication dated Sep. 17, 2018 in counterpart application No. 201680004414.9.

* cited by examiner

*Primary Examiner* — Lynda Salvatore
(74) *Attorney, Agent, or Firm* — Sughrue Mion, PLLC

(57) ABSTRACT

The present invention provides a graphite sheet having a ratio of thermal diffusivity in horizontal and vertical directions of 300 or more. Also, the present invention provides a graphite sheet having a ratio of thermal diffusivity in a vertical direction of 2.0 mm²/s or less. The graphite sheet has excellent thermal conductivity in horizontal and vertical directions and excellent flexibility at the same time and can be produced at low manufacturing cost, thereby holding an economic advantage.

4 Claims, 1 Drawing Sheet

GRAPHITE SHEET AND METHOD FOR MANUFACTURING SAME

TECHNICAL FIELD

The present invention relates to a graphite sheet having a high ratio of thermal diffusivities in the horizontal/vertical directions and good flexibility at the same time, and a method for preparing same.

BACKGROUND ART

Recently, electronic devices have been lighter, thinner, shorter, and smaller, and also highly integrated for being multifunctional, resulting in increases in heat density therein. Thus, they are required to address heat radiation problems. Radiation of heat is critical since it is also closely related with the reliability and life span of the devices. Accordingly, various heat sinks have been developed and marketed in the form of heat dissipating pads, heat dissipating sheets, heat dissipating paints, etc. They assist or replace such conventional heat dissipating devices as heat dissipating fans, heat dissipating pins, and heat dissipating pipes.

The heat dissipating sheets are manufactured as graphite sheets, polymer-ceramic composite sheets, multicoated thin metal sheets, etc. The graphite sheets are light and slim, as well as have thermal conductivities comparable to, or even higher than, that of copper. Thus, they are used between electronic circuit boards, in a PDP for plasma televisions, etc.

A typical example of preparing film-shaped graphite includes a method referred to as "graphite expansion method." In this method, graphite is prepared by immersing natural graphite in a mixture of concentrated sulfuric acid and concentrated acetic acid, and rapidly heating it. After the acids are removed by washing, the graphite thus obtained is formed into a film shape using a high pressure press. However, the film-shaped graphite thus prepared has defects that it has weak strength, its other physical properties are not so good, and there are potential adverse impacts of any residual acids.

In order to deal with the above defects, a method of graphitization by directly thermally treating a specific polymer film has been developed (hereinafter, referred to as "polymer graphitization method"). The polymer film used in this method includes, for example, polyoxadiazole, polyimide, polyphenylenevinylene, polybenzoimidazole, polybenzoxazole, polythiazole, and polyamide films. The polymer graphitization method is very simple compared with the conventional graphite expansion method and is characterized in that it essentially does not involve impurities such as acids and that graphite produced in this method has a good thermal conductivity or electric conductivity close to those of single crystalline graphite (see Japanese Laid-open Patent Publication Nos. Sho 60-181129, Hei 7-109171, and Sho 61-275116).

Further, in the polymer graphitization method, an additive such as carbon nanotube is added to a polymer film to improve the mechanical properties of the graphite (see Japanese Patent No. 5275721).

It, however, is difficult for the polymer graphitization method to produce graphite in a thick film compared with the graphite expansion method.

Although the conventional graphite sheets have a high thermal diffusivity (or thermal conductivity) in the horizontal direction, they have a low thermal diffusivity in the vertical direction and are expensive.

DISCLOSURE OF INVENTION

Technical Problem

An object of the present invention is to provide a graphite sheet having a high ratio of thermal diffusivities in the horizontal/vertical directions by lowering the thermal diffusivity in the vertical direction and raising the thermal diffusivity in the horizontal direction, and a method for preparing same.

Another object of the present invention is to provide a graphite sheet having a high ratio of thermal diffusivities in the horizontal/vertical directions and good flexibility at the same time.

Solution to Problem

The present invention provides a graphite sheet having a ratio of thermal diffusivities in the horizontal/vertical directions of 300 or more.

The present invention provides a graphite sheet having a thermal diffusivity in the vertical direction of 2.0 mm$^2$/s or less.

The present invention provides a method for manufacturing a graphite sheet, comprising (1) providing a base comprising a natural fiber, a synthetic fiber, or paper; (2) first coating one side or both sides of the base with a coating solution comprising at least one selected from the group consisting of a polymer, a carbonized polymer, and graphite; and (3) graphitizing the coated base by thermally treating it.

The present invention provides a graphite sheet comprising an inner layer comprising a graphite fiber and a graphite outer layer covering one side or both sides of the inner layer.

Advantageous Effects of Invention

The graphite sheet of the present invention has a high ratio of thermal diffusivities in the horizontal/vertical directions as it has a low thermal diffusivity in the vertical direction and a high thermal diffusivity in the horizontal direction, along with good flexibility at the same time.

In addition, the graphite sheet may be manufactured at low manufacturing costs using a relatively inexpensive fiber base, instead of an expensive polyimide film (PI film).

BEST MODE FOR CARRYING OUT THE INVENTION

Figure 1:
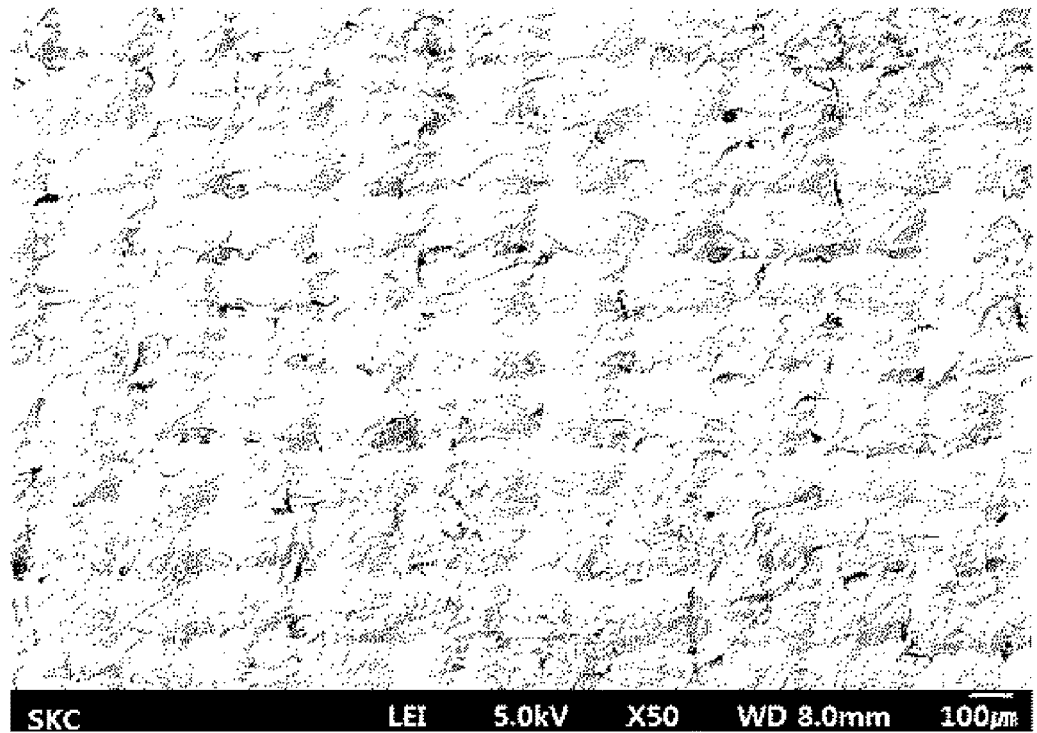
FIGS. 1 and 2 are scanning electron microscope (SEM) images of a surface and a cross-section of the base of the graphite sheet according to an embodiment of the present invention.
Figure 2:
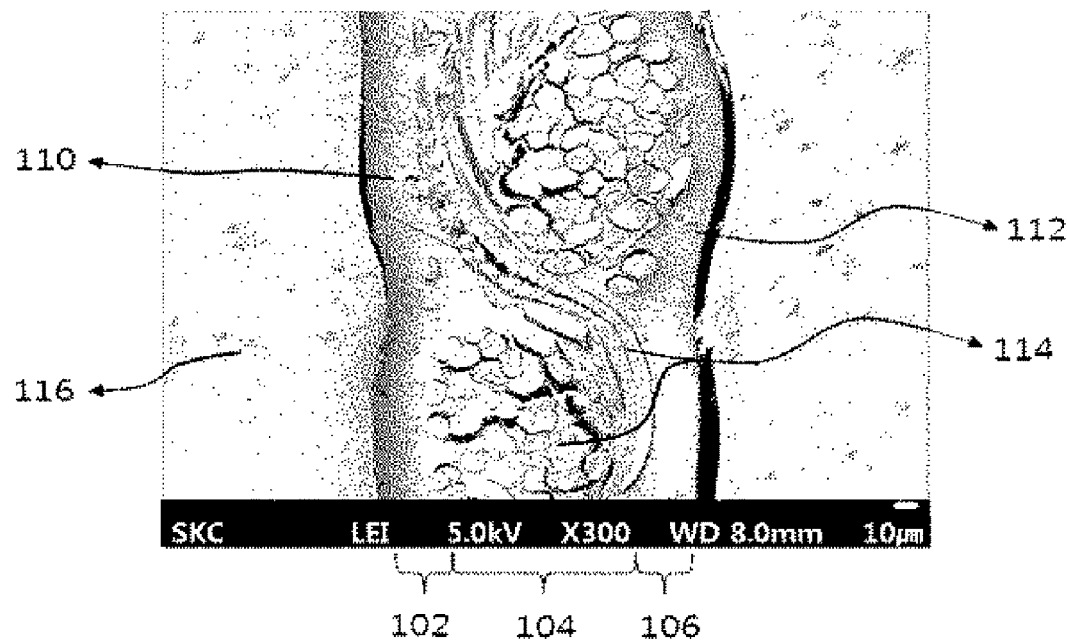

The present invention relates to a graphite sheet obtained by thermally treating (i) a base comprising a natural fiber, a synthetic fiber, or paper, and (ii) a coating layer provided on one side or both sides of the base and comprising at least one selected from the group consisting of a polymer, a carbonized polymer, and graphite.

In the graphite sheet according to the present invention, the base may be composed of a natural fiber, and the natural fiber may be largely classified into a cellulose fiber, a protein fiber, and a mineral fiber. The cellulose fiber may include (i) a seed fiber such as cotton and kapok, (ii) a stem fiber such as flax, ramie, cannabis, and jute, (iii) a fruit fiber such as a coir fiber, and (iv) a leaf fiber such as Manila hemp, abaca, and sisal hemp. The protein fiber includes (i) a sheep fiber, (ii) a silk fiber, and (iii) a hair fiber. In case where the base constituting the graphite sheet according to the present invention is composed of a natural fiber, the natural fiber may preferably be at least one natural fiber selected from the group consisting of cotton, hemp, wool, and silk.

Further, in the graphite sheet according to the present invention, the base may be composed of a synthetic fiber, and the synthetic fiber may be largely classified into an organic fiber and an inorganic fiber. The organic fiber may include (i) a regenerated fiber including a cellulose-based fiber such as rayon, a tencil fiber (or lyocell), and modale, and a protein-based fiber, (ii) a semi-synthetic fiber including a cellulose-based fiber such as acetate and triacetate, or (iii) a synthetic fiber such as a polyamide fiber, a polyester fiber, a polyurethane fiber, a polyethylene fiber, a polyvinyl chloride fiber, a polyfluoroethylene fiber, a polyvinyl alcohol fiber, an acrylic fiber, and a polypropylene fiber. In case where the base constituting the graphite sheet according to the present invention is composed of a synthetic fiber, the synthetic fiber may be at least one synthetic fiber selected from the group consisting of nylon, polyester, polyurethane, polyethylene, polyvinyl chloride, polyfluoroethylene, polyvinyl alcohol, acryl, and polypropylene; or at least one cellulose-based fiber selected from the group consisting of rayon, acetate, and triacetate.

In addition, in the graphite sheet according to the present invention, the base may be composed of paper.

In the graphite sheet according to the present invention, the coating layer may comprise a polymer. The polymer may be at least one selected from the group consisting of polyimide, polyamic acid, polyvinyl chloride, polyester, polyurethane, polyethylene, polyfluoroethylene, polyvinyl alcohol, acryl, and polypropylene. Particularly, the polymer may be at least one selected from the group consisting of polyimide, polyamic acid, and polyvinyl chloride having a weight average molecular weight of 200,000-300,000.

In the graphite sheet according to the present invention, the coating layer may comprise a carbonized polymer. The carbonized polymer may be obtained by thermally treating a polymer in an inert gas atmosphere such as nitrogen and argon at a temperature of 800 to 1,800° C., particularly 1,000 to 1,400° C. The carbonized polymer may comprise carbon in an amount of 90 wt % or more based on the total amount of the coating layer. Depending on the kind of the polymer used, carbon contained in the carbonized polymer may be in an amount of about 2 to 50 wt % based on the initial amount of the polymer.

In the graphite sheet according to the present invention, the coating layer may comprise graphite. The graphite may be natural graphite or expanded graphite. The expanded graphite refers to graphite obtained by treating natural graphite, pyrolytic graphite, kish graphite, etc., with a mixture of sulfuric acid, nitric acid, etc., washing, drying, and expanding it in an expansion furnace at about 1,000° C.

In the graphite sheet according to the present invention, the coating layer may comprise at least one selected from the group consisting of polyamic acid, polyimide, and graphite.

The graphite sheet of the present invention may have a ratio of thermal diffusivities in the horizontal/vertical directions of 300 or more, 400 or more, or 500 or more. Specifically, the ratio of thermal diffusivities in the horizontal/vertical directions may be 300 to 2,000; 300 to 1,800; 300 to 1,500; 400 to 1,250; or 500 to 1,000.

The graphite sheet of the present invention may have a thermal diffusivity in the horizontal direction of 100 to 1,000 mm$^2$/s, 200 to 800 mm$^2$/s, or 400 to 600 mm$^2$/s.

The graphite sheet of the present invention may have a thermal diffusivity in the vertical direction of 2.0 mm$^2$/s or less, or 1.0 mm$^2$/s or less. Specifically, the thermal diffusivity in the vertical direction may be 0.1 to 1 mm$^2$/s, 0.2 to 2 mm$^2$/s, or 0.3 to 2 mm$^2$/s.

Further, the number of oscillating folds until breakage of the graphite sheet of the present invention is 10,000 or more when tested in accordance with the MIT method under conditions of a radius of curvature (R) of 5 mm, a folding angle of 180 degrees, a load of 0.98 N, and a folding speed of 90 times/minute.

In an embodiment of the present invention, the graphite sheet according to the present invention is characterized in that the shape of a cross-section of the base is the same as the shape of the natural fiber, the synthetic fiber, or the paper constituting the sheet. For example, as shown in FIG. 1, in case where the base is composed of a cellulose fiber, a cross-section of the base of the graphite sheet is the same as the shape of the cellulose fiber.

The present invention provides a method for manufacturing a graphite sheet, comprising (1) providing a base comprising a natural fiber, a synthetic fiber, or paper; (2) first coating one side or both sides of the base with a coating solution comprising at least one selected from the group consisting of a polymer, a carbonized polymer, and graphite; and (3) graphitizing the coated base by thermally treating it.

In step (2) of the present method, a conventional coating process may be employed such as a rolling process, a bar coating process, a dip coating process, a spray coating process, etc. Preferred is the rolling process or the bar coating process. Particularly, in case of using a liquid phase polyamic acid having a high viscosity as a coating solution, the rolling process may be preferred for effective coating of a base.

In an embodiment of the present invention, the manufacturing method of the graphite sheet may further comprise second coating the same coating solution onto the first coating layer after the first coating. Here, the first coating is mainly performed for the purpose of filling the gaps in the cotton fabric with a polymer, and the second coating is for adjusting the coating thickness. Preferably, the second coating may be performed once to three times.

In another embodiment of the present invention, the manufacturing method of the graphite sheet may further comprise rolling the coated base after the first coating. The rolling is performed for the purpose of rendering uniform the thickness of the coating layer.

In another embodiment of the present invention, the coating solution may comprise a polyamic acid, and the method may further comprise imidizing the coated base after the first coating.

Step (3) of the present method may comprise a carbonization process, a graphitization process, and a post-treatment process.

In the carbonization process, the base and the coating layer may be carbonized by heating at 800 to 1,800° C., particularly at 1,000 to 1,400° C., more particularly at about 1,000° C., for 1 to 20 hours.

In the graphitization process, the carbonized base layer and coating layer may be graphitized by heating at 2,000 to 2,900° C., particularly at about 2,850° C., for 1 to 20 hours to obtain a graphite sheet.

In the post-treatment process, the graphite sheet obtained in the graphitization process is subjected to post-treatment with an acid or under pressure to impart flexibility to the graphite sheet.

The acid may be any materials that may intercalate between graphite layers and produce acid ions (anions) for expansion in the C-axis direction of the graphite crystal. Preferred is sulfuric acid. More preferred is a concentrated sulfuric acid solution in a concentration of 95 wt % or more. For example, a graphite sheet is immersed in a sulfuric acid solution and heated to a typical temperature, if necessary, for expansion in the C-axis direction between the graphite layers, thereby yielding a flexible graphite sheet.

For example, pressure may be applied using a roll press.

Further, the present invention provides a graphite sheet comprising an inner layer comprising a graphite fiber and a graphite outer layer covering one side or both sides of the inner layer.

The inner layer may be composed of a bundle of a plurality of graphite fibers. The fiber bundle may comprise pores formed between the plurality of graphite fibers. The inner layer may comprise a fabric in which wefts and warps made of a graphite fiber or a graphite fiber bundle are woven.

The graphite outer layer comprise a first graphite outer layer covering one side of the graphite inner layer and a second graphite outer layer covering the other side of the graphite inner layer. The first graphite outer layer and the second graphite outer layer may be partially connected to each other.

MODE FOR THE INVENTION

Hereinafter, the present invention is explained in detail by Examples. The following Examples are intended to further illustrate the present invention without limiting its scope.

EXAMPLES

Example 1

(1) Preparation of a Base

As a base composed of a cellulose-based fiber, a plain weave cotton fabric (100 su, 150 mm×100 mm, made in China) was prepared.

(2) First Coating and Second Coating

A liquid phase polyamic acid (manufacturer: KOLON PI, trade name: PAA Varnish, weight average molecular weight: 250,000) was coated onto both sides of the base by a rolling process at 25° C. in a thickness of 175 μm. The same coating solution was coated onto the first coating layer as a second coating in a thickness of 150 μm, to thereby yield a base film.

(3) Imidization

The base film prepared in step (2) was placed in a nitrogen atmosphere (at a pressure of about 100 torr), and the temperature was elevated at a rate of 1° C./min. The base film was heated at about 400° C. for about 10 hours to yield an imidized base film in a thickness of 140 to 160 μm.

(4) Carbonization, Graphitization, and Post-Treatment

The imidized base film prepared in step (3) was placed in a nitrogen gas or inert gas atmosphere (at a pressure of about 100 torr), and the temperature was elevated at a rate of 1° C./min. The imidized base film was heated at about 1,000° C. for about 3 hours for carbonization thereof. The temperature was then elevated at a rate of 5° C./min, and the carbonized base film was heated at about 2,600° C. for about 1 hour for graphitization thereof. As a post-treatment, the graphitized base sheet was pressed under a load of 10 tons using a roll press to yield a graphite sheet in a thickness of about 40 μm.

Example 2

A graphite sheet in a thickness of about 40 μm was manufactured according to the same procedures as described in Example 1, except that a rayon fabric stead of a cotton fabric was used.

Comparative Example 1

A graphite sheet in a thickness of about 40 μm was manufactured according to the same carbonization, graphitization, and post-treatment as described in Example 1, except that a polyimide film (in a thickness of about 75 μm, manufacturer: KOLON PI, trade name: PI Film 75 μm) was used as the base film of Example 1.

Experimental Examples

<Measurement of Thermal Diffusivity>

The thermal diffusivities in the horizontal and vertical directions of the graphite sheets manufactured in the Examples and the Comparative Example were measured using a thermal diffusivity measurement apparatus (manufactured by Netsch Co., "LFA447 Nanoflash") in accordance with the light alternating-current method. Particularly, the graphite sheets were cut to a size of Φ25.4 mm and Φ12.6 mm, respectively, and the thermal diffusivities in the horizontal and vertical directions were measured 5 times or more at 25° C., and their average values were calculated.

<Measurement of Flexibility>

The flexibility of the graphite sheets manufactured in the Examples and the Comparative Example was evaluated by the MIT flexibility test. In the MIT flexibility test, a tetragonal specimen having a width of 20 mm was subjected to repeated folding until it breaks under conditions of a radius of curvature (R) of 5 mm, a folding angle of 180 degrees, a load of 0.98 N, and a folding speed of 90 times/minute. The flexibility was evaluated by the number of oscillating folds until breakage in the MIT flexibility test.

The results are shown in the following Table 1.

TABLE 1

|  | Base | Coating layer | Sheet thickness (μm) | Horizontal thermal diffusivity (mm$^2$/s) | Vertical thermal diffusivity (mm$^2$/s) | Horizontal/vertical thermal diffusivity ratio | Flexibility |
|---|---|---|---|---|---|---|---|
| Example 1 | Cotton | Polyamic acid | 40 | 500 | 0.5 | 1,000 | 12,311 |
| Example 2 | Rayon | Polyamic acid | 40 | 450 | 0.8 | 562.5 | 13,456 |

TABLE 1-continued

| | Base | Coating layer | Sheet thickness (μm) | Horizontal thermal diffusivity (mm²/s) | Vertical thermal diffusivity (mm²/s) | Horizontal/ vertical thermal diffusivity ratio | Flexibility |
|---|---|---|---|---|---|---|---|
| Comparative Example 1 | Polyimide film | — | 40 | 520 | 2.7 | 193 | 8,760 |

From the measured results, as shown in Table 1, the graphite sheets according to the present invention have a high ratio of thermal diffusivities in the horizontal/vertical directions by maintaining a high thermal diffusivity in the horizontal direction and a low thermal diffusivity in the vertical direction. It is also confirmed that the graphite sheets according to the present invention have a high ratio of thermal diffusivities in the horizontal/vertical directions and good flexibility at the same time. Since the graphite sheets according to the present invention use a cotton or rayon fabric for the base, they may be produced at low costs with economic advantages.

EXPLANATION OF REFERENCE NUMERALS

102, 106, 110 and 112: Graphite outer layer (Coating layer graphite)
104: Graphite inner layer (Base layer graphite)
114: Fiber bundle comprising graphite fibers
116: Molding material used for taking scanning electron microscope (SEM) images

The invention claimed is:

1. A graphite sheet comprising an inner layer comprising a graphite fiber and graphite outer layers covering both sides of the inner layer,
wherein the graphite outer layers comprise a first graphite outer layer covering one side of the inner layer and a second graphite outer layer covering the other side of the graphite inner layer,
wherein the first graphite outer layer and the second graphite outer layer are partially connected to each other,
wherein the graphite sheet has a ratio of thermal diffusivities in the horizontal direction and in the vertical direction of 500 or more,
wherein the number of oscillating folds until breakage of the graphite sheet is 10,000 or more when tested in accordance with the MIT test under conditions of a radius of curvature (R) of 5 mm, a folding angle of 180 degrees, a load of 0.98 N, and a folding speed of 90 times/minute, and
wherein the graphite sheet has a thermal diffusivity in the vertical direction of 1.0 mm²/s or less.

2. The graphite sheet of claim 1, wherein the inner layer is composed of a fiber bundle comprising a plurality of graphite fibers.

3. The graphite sheet of claim 2, wherein the fiber bundle comprises pores formed between individual graphite fibers of the plurality of graphite fibers.

4. The graphite sheet of claim 1, wherein the inner layer comprises a fabric in which wefts and warps composed of a graphite fiber or a graphite fiber bundle are woven.

* * * * *